United States Patent [19]

Nakasuji

[11] Patent Number: 5,763,893
[45] Date of Patent: Jun. 9, 1998

[54] ELECTRON GUN AND ELECTRON-BEAM TRANSFER APPARATUS COMPRISING SAME

[75] Inventor: Mamoru Nakasuji, Yokohama, Japan

[73] Assignee: Nikon Corporation, Tokyo, Japan

[21] Appl. No.: 766,088

[22] Filed: Dec. 16, 1996

[30] Foreign Application Priority Data

Dec. 26, 1995 [JP] Japan ................. 7-338373

[51] Int. Cl.$^6$ ........................................... H01J 37/30
[52] U.S. Cl. .................. 250/492.2; 250/492.23; 250/423 F
[58] Field of Search ............. 250/492.2, 492.23, 250/423 F, 398, 396 R; 313/336

[56] References Cited

U.S. PATENT DOCUMENTS

| | | | |
|---|---|---|---|
| 4,731,537 | 3/1988 | Williams et al. | 250/492.2 |
| 5,041,732 | 8/1991 | Saito et al. | 250/423 F |
| 5,616,926 | 4/1997 | Shinada et al. | 250/423 F |
| 5,633,507 | 5/1997 | Pfeiffer et al. | 250/423 F |

FOREIGN PATENT DOCUMENTS 5-190430  7/1993  Japan .

OTHER PUBLICATIONS

DeVore et al., "High Emmittance Electron Gun for Projection Lithography," The 40th Int'l Conf. on Electron, Ion and Photon Beam Technology and Nanofabrication, Atlanta, Georgia, May 28–31, 1996 (abstract only).

Nagami, Electro–Ion Beam Handbook, pp. 42–49, Nikkann–Kogyo Shinnbunnsya, Chiyoda-ku, Tokyo, Japan (1973). (English translation attached).

Primary Examiner—Kiet T. Nguyen
Attorney, Agent, or Firm—Klarquist Sparkman Campbell Leigh & Whinston, LLP

[57] ABSTRACT

Electron guns particularly suitable for electron-beam projection microlithography are disclosed. The electron guns produce an electron beam having a uniform intensity distribution over a wide field, and that permit electron-beam brightness to be varied over a wide range. The electron gun comprises a cathode including a planar circular emission surface. Arranged in sequence along an optical axis from the cathode are a Wehnelt (focusing electrode), an anode, and a ground electrode. The Wehnelt includes a conical upper surface exhibiting a half-angle $\theta 1$ relative to the axis of 67.5°. The anode includes a conical surface axially facing the cathode, the conical surface being concave with respect to the cathode. The anode also includes a conical surface axially facing the ground electrode, the conical surface being concave with respect to the ground electrode. The anode can be energized with a variable electric potential 0.1–10 kV higher than the potential of the cathode. The ground electrode comprises a conical surface axially facing the anode, the conical surface being convex with respect to the anode. Also disclosed are electron-beam projection-lithography apparatus comprising such electron guns.

25 Claims, 3 Drawing Sheets

ELECTRON GUN AND ELECTRON-BEAM TRANSFER APPARATUS COMPRISING SAME

FIELD OF THE INVENTION

The invention pertains generally to electron guns. The invention also pertains to electron-beam projection-lithography apparatus (electron-beam transfer apparatus) employing such guns, especially such apparatus as used for simultaneously transferring a wide-field pattern, as defined by a reticle or mask, onto a substrate. Such apparatus have especial utility for fabricating semiconductor integrated circuits such as four-gigabit DRAMs and the like.

BACKGROUND OF THE INVENTION

In electron-beam projection microlithography as used in the fabrication of semiconductor integrated circuits, a circuit pattern defined by a reticle or mask is irradiated with an electron beam emitted from an electron gun. The electron beam propagates generally along an optical axis through a condenser lens system, through the reticle, through a "projection lens" system, through an "objective lens" system, and onto the surface of a substrate such as a semiconductor wafer. The beam is suitably deflected to be incident on desired regions of the reticle and the wafer by deflectors. In propagating from the projection lens system to the objective lens system, the electron beam normally traverses the optical axis at a location termed a "cross-over"; the cross-over is normally the location at which an image of the electron-beam source (electron gun) is formed by the projection lens system. The circuit pattern as formed on the substrate surface is usually reduced relative to the pattern defined by the reticle.

Multiple integrated-circuit devices can usually be formed on a single wafer. The region occupied by a single device is termed a "die," and the reticle usually defines the pattern to be transferred for one die.

Because of its greater potential, compared to optical microlithography, for achieving smaller feature sizes on integrated circuits, electron-beam projection microlithography is a favored candidate microlithography process for fabricating four-gigabit DRAMs and other semiconductor devices requiring very small feature sizes (e.g., 0.25 µm or less).

Recently, in order to improve feature resolution by minimizing aberrations imparted to the electron beam, electron-beam projection-lithography apparatus have been developed that operate by a so-called step-and-repeat transfer method for each die. In such methods, the pattern on the reticle is subdivided into multiple subfields that are sequentially transferred to the substrate subfield-by-subfield (each subfield representing a "transfer unit", i.e., the unit of pattern transferred to the wafer per exposure by the electron beam) to create the pattern for the entire die. Having to incrementally transfer multiple subfields per die requires more time than transferring the entire reticle pattern in a single exposure; thus, the former can have a slower throughput than the latter.

In order to increase throughput in the foregoing step-and-repeat scheme, increasing the size of the subfields transferred per exposure has been considered. However, this requires an electron gun capable of producing an irradiating electron beam having a uniform intensity distribution over a wider field than is obtainable with current equipment.

In addition, depending on the reticle used, subfield sizes and shapes are not always the same; thus, an electron gun in which the brightness can be controllably varied (i.e., in which the electron-beam irradiation current density per subfield can be varied) over a substantial range would be advantageous. Unfortunately, available electron guns are variable in this manner over too limited a range.

Figure 3:
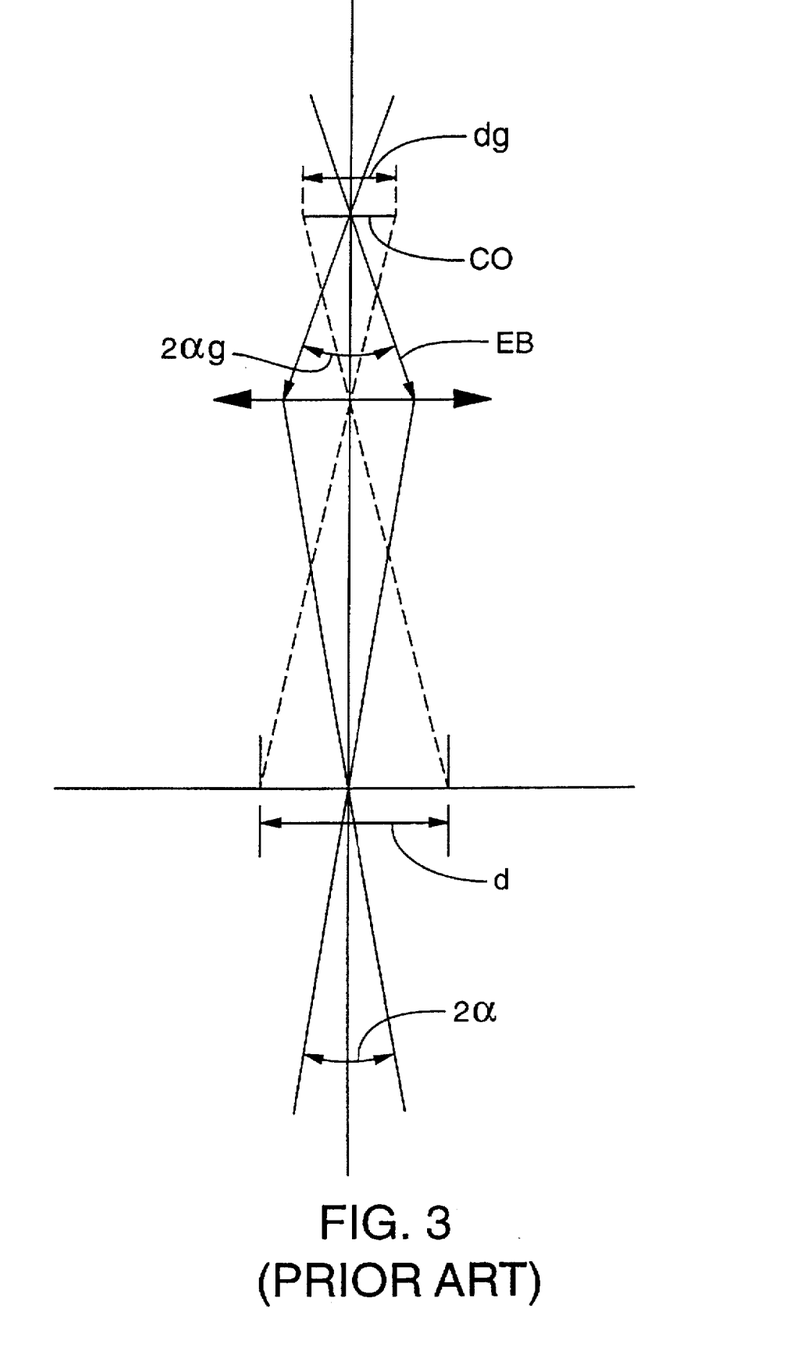
FIG. 3 (Prior Art) is a diagram showing certain quantitative aspects of electron-gun emittance.

A key parameter of an electron gun, as shown in FIG. 3 (Prior Art), is its emittance. With respect to an electron beam emitted by the subject electron gun, the emittance is the product of the diameter $d_g$ of the gun cross-over CO and the total angle $2 \cdot \alpha_g$, wherein $\alpha_g$ is the beam half-angle where the intensity of the electron beam propagating from the cross-over CO is 99% of its maximum value. This relationship is expressed as follows:

$$Emittance = d_g \cdot 2\alpha_g \qquad (1)$$

In general, the greater the emittance, the wider the field over which the electron beam can irradiate with a uniform intensity distribution. Moreover, since increasing the beam half-angle α at the objective lens system normally causes the uniform-irradiated diameter d to be reduced, the value of the emittance according to Equation (1) is determined by the electron gun itself and cannot be increased by the lens system. In conventional electron-beam projection-lithography apparatus, electron-gun emittances are in the range of 40–50 µm·mrad. A known example of such an electron gun comprises three electrodes: a convex cathode, a "Wehnelt" electrode (focusing electrode) having an electric potential that is much less than the electric potential of the cathode, and a grounded anode. Notwithstanding, an emittance range greater than available with such conventional electron guns is needed.

Prior-art electron guns having a convex cathode have been problematic, especially in step-and-repeat lithography systems, because of the characteristic low emittance of such electron guns. Thus, it has been difficult in such systems to irradiate wide-field reticle patterns with an electron beam having a uniform intensity distribution. It has also been difficult to achieve a sufficiently low electron-beam brightness while simultaneously increasing the range over which brightness can be varied.

A reductive electron-beam projection-lithography apparatus is known that employs an electron gun comprising a cathode having an electron-beam emission surface that is planar over a temperature-limited current range (the range for which the cathode temperature is low and the electron beam current is more or less determined simply by cathode temperature) or under critical Köhler illumination conditions. In order to use such an electron gun, it is necessary to optically conjugate the electron-beam emission surface and the mask surface. This requires an additional lens stage in the lithographic apparatus. This adds excessive complication to the apparatus and increases the possibility of unwanted aberrations. Moreover, because the image of the electron-beam emission surface is projected onto the reticle surface, any variance in the work function at the electron-beam emission surface results in a corresponding variance in the current density of the electron beam irradiating the reticle surface. This makes it difficult to transfer reticle subfields at a uniform current density, and results in corresponding variances in linewidth precision on the wafer. Furthermore, because such electron guns are preferably used over a temperature-limited current range, fluctuations in cathode temperature can cause fluctuations in electron-gun current, brightness, and beam current. Such effects can prevent stable transfer of the reticle pattern to the wafer surface.

SUMMARY OF THE INVENTION

In light of the foregoing deficiencies of the prior art, an object of the present invention is to provide electron guns operable to perform electron-beam irradiation, in a projection-lithography apparatus, with a uniform intensity distribution over a wide field. A second object is to provide such electron guns in which the brightness can be varied over a wide range as circumstances demand. Yet another object is to provide an electron-beam projection-lithography apparatus comprising such an electron gun.

According to one aspect of the present invention, an electron gun is provided that, according to a preferred embodiment thereof, comprises a cathode, a focusing electrode, an anode, and a ground electrode coaxially disposed along an optical axis in the trajectory direction of the electron beam produced by the electron gun. The cathode comprises a circular emission surface that is planar relative to the optical axis, and the cathode is operable to produce the electron beam whenever an electric potential is applied to the cathode. The focusing ("Wehnelt") electrode is adapted to have an electric potential applied to it that has a magnitude that is less than or equal to the electric potential applied to the cathode. The anode is adapted to have an electric potential applied to it that has a higher magnitude than the electric potential applied to the cathode. The electric potential applied to the anode can be variable. The ground electrode is adapted to have a ground potential.

Preferably, the electron gun as briefly described above can have one or more of the following characteristics:

(1) The anode comprises a conical surface axially facing the ground electrode, the conical surface being concave with respect to the ground electrode.

(2) The ground electrode comprises a conical surface axially facing the anode, the conical surface being convex with respect to the anode.

(3) The anode comprises a conical surface axially facing the cathode, the conical surface being concave with respect to the anode.

(4) The focusing electrode comprises a conical surface axially facing the anode, the conical surface being concave with respect to the anode.

Further preferably, the conical surface described in (1), above, defines a half angle relative to the optical axis of about 80 degrees. Alternatively or, preferably, in addition, the conical surface described in (4), above, defines a half angle relative to the optical axis of about 67.5 degrees.

According to yet another aspect of the present invention, an electron-beam projection-lithography apparatus is provided. According to a preferred embodiment, the apparatus comprises an electron gun as briefly described above. The apparatus further comprises an irradiation system that is operable to convert the electron beam emitted by the electron gun into a collimated electron beam that can irradiate a pattern defined by a reticle disposed across the trajectory of the collimated electron beam. The apparatus further comprises an imaging lens system that is operable to focus the electron beam, after the beam has passed through the reticle, onto the surface of a substrate. Thus, the apparatus achieves transfer of the pattern onto the substrate surface.

The foregoing and additional features and advantages of the present invention will be more readily apparent from the following detailed description, which proceeds with reference to the accompanying drawings.

DETAILED DESCRIPTION

Figure 2:
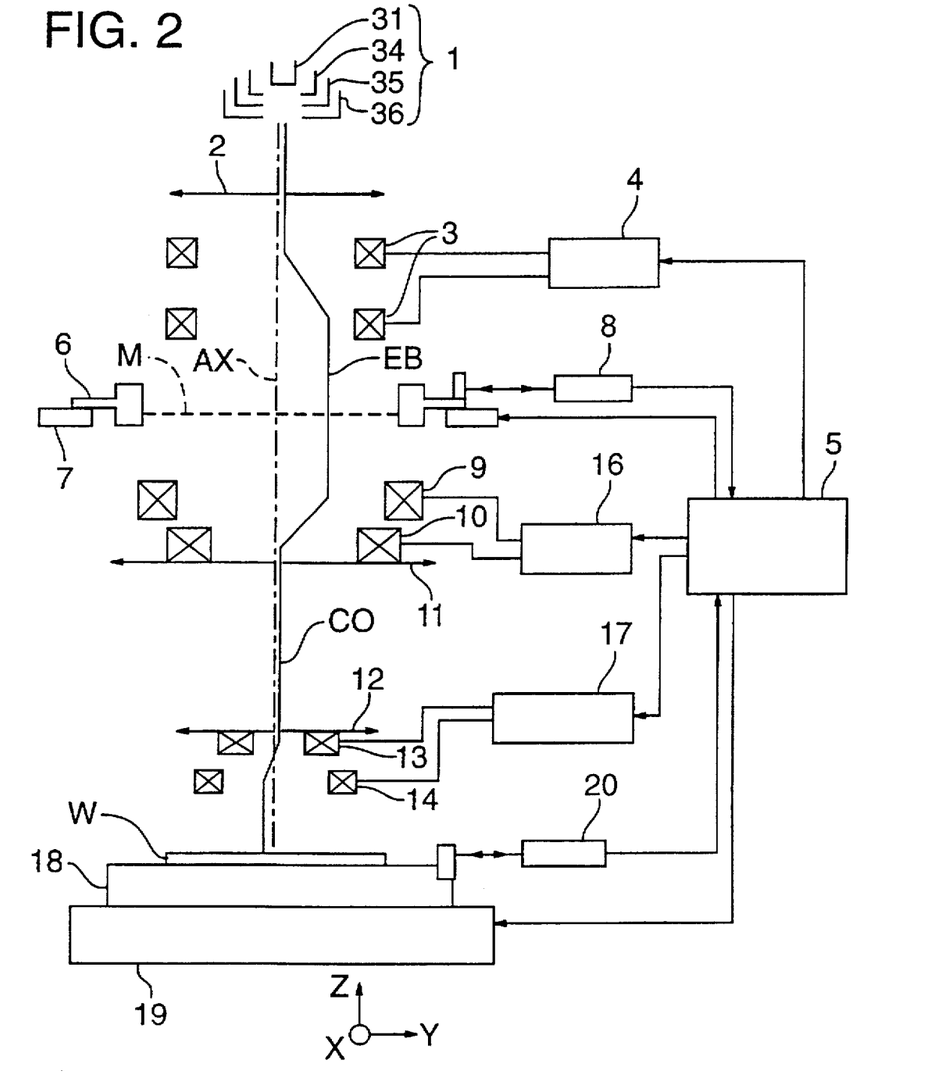
FIG. 2 is a schematic diagram of a preferred embodiment of an electron-beam projection-lithography apparatus, according to the invention, including an electron gun according to the invention.

Turning first to FIG. 2, an electron gun according to the present invention comprises, in sequential arrangement along an optical axis AX in the direction of propagation of an electron beam: a cathode 31 comprising an electron-emission surface preferably having a circular profile transverse to the optical axis AX; a "Wehnelt" electrode (focusing electrode) 34 to which is applied an electric potential no greater than the potential applied to the cathode; an anode 35 to which is applied an electric potential higher than the potential of the cathode; and a ground electrode 36 that is grounded to earth.

Figure 1:
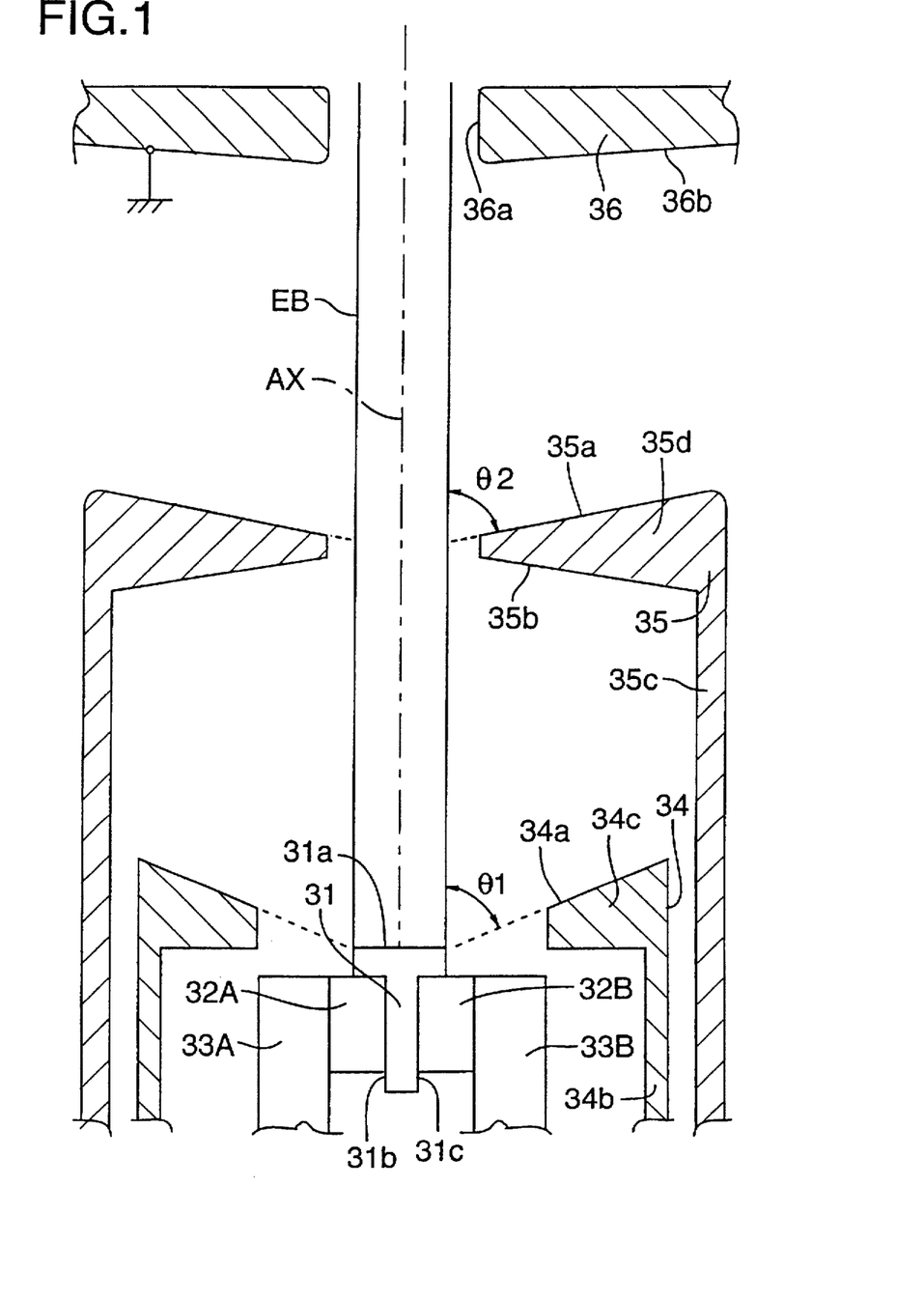
FIG. 1 is a sectional elevational view showing general features of an electron gun according to the present invention as well as specific features of an example embodiment of an electron gun according to the invention.

More specific details of the electron gun are shown in FIG. 1. As stated above, the cathode 31 includes a planar electron-emission surface 31a preferably having a circular profile transverse to the optical axis AX. The electron-emission surface has a substantially uniform electric-field intensity distribution; the cathode current density is substantially constant over the entire electron-emission surface 31a. Accordingly, an electron beam emitted from the electron-emission surface 31a experiences less angular dependence of electron-beam intensity when a downstream condenser lens or the like is employed to converge or diverge the electron beam. Thus, the total angle $2 \cdot \alpha_g$ (i.e., the angle over which the electron beam exhibits a uniform intensity, where $\alpha_g$ is the half-angle, see FIG. 3) is larger with such an electron gun.

Turning to FIG. 3 (Prior Art), the diameter $d_g$ of the cross-over CO on the optical axis AX at which the electron beam EB converges (i.e., is focused by a gun lens) is determined by the angular dependence of the initial velocities of the electrons at the electron-emission surface 31a of the cathode 31 and by the effective focal length of the gun lens. The diameter $d_g$ of the cross-over CO is substantially constant if the cathode temperature is constant and if the effective focal length of the gun lens is constant. Accordingly, the emittance (emittance=$d_g \cdot 2\alpha_g$) increases by an amount corresponding to the increase in the total angle ($2\alpha_g$) of the electron beam. This allows an electron gun according to the present invention to produce an electron beam (especially for irradiation of a reticle) having a uniform intensity distribution over a wide field.

It is preferable that the electric potential of the anode 35 be variable. This allows other electron-gun characteristics (e.g., cathode current, beam-current density, brightness, beam current, etc.) to be controlled by changing the electric potential of the anode 35. This, in combination with the adjustability of the current density of the cathode 35, greatly increases the range over which brightness of the electron gun can be varied.

Returning to FIG. 1, the anode 35 includes a surface 35a that is preferably conical facing the ground electrode 36. Thus, the surface 35a is a concave surface with respect to the ground electrode 36, and the anode 35 is a concave lens operable to, inter alia, prevent the electron beam EB from converging immediately after being emitted from the cathode 31.

The ground electrode 36 has a surface 36a that is preferably conical facing the anode 35. Thus, the surface 36a is a convex surface with respect to the anode 35, and the ground electrode 36 is a convex lens operable to, inter alia, prevent divergence of the electron beam EB after being emitted from the cathode.

The anode 35 has a surface 35b that is preferably conical facing the cathode 31. Thus, the surface 35b is a concave surface with respect to the cathode 31, and the negative refractive power of the anode 35 is increased.

It is also preferable that the cathode 31 be heated, and that the electron gun be used over a space-charge-limited current range (i.e., under conditions in which, as a result of increasing the cathode temperature and increasing thermionic emission, space charges are increased and beam-current magnitude is governed by the space-charge layer, while beam current is more or less determined by anode voltage). This causes the electron gun to exhibit no change in brightness even with small fluctuations in cathode 31 temperature. Even if there is a fluctuation in the work function at the electron-emission surface 31a of the cathode 31, directional uniformity of electron-beam intensity is not impaired.

An electron-beam projection-lithography apparatus according to the invention (FIG. 2) comprises an electron gun 1 as described generally above. The apparatus also comprises an irradiation system (condenser lens) 2 operable to collimate the electron beam EB prior to irradiation of a reticle (mask) M. An imaging lens system (projection lens and objective lens) 11, 12 focuses the electron beam EB, after the beam has passed through a region on the reticle M, onto a substrate (wafer) W, thereby transferring the pattern defined by the region of the reticle M irradiated by the beam onto the wafer surface. Use of an electron gun 1 as described above allows the pattern defined by a wide-field reticle subfield to be transferred to the wafer W in a single exposure.

An example embodiment, representing the current best mode, of an electron gun according to the invention is more specifically described below with reference to FIG. 1.

In FIG. 1, the cathode 31 is preferably a tip of a columnar monocrystal of lanthanum hexaboride ($LaB_6$). The cathode 31 comprises an electron-emission surface 31a that is planar transverse to the optical axis AX which passes through the center of the electron-emission surface 31a. The cathode 31 defines opposing flat cutouts 31b, 31c parallel to the optical axis AX. The flat cutouts 31b, 31c allow the cathode 31 to be sandwiched between opposing heating elements 32A, 32B (preferably made of graphite), which in turn are sandwiched between opposing electrodes 33A, 33B. The electrodes 33A, 33B serve, inter alia, as support fixtures.

The FIG. 1 embodiment also comprises, as sequentially arranged along the optical axis AX in the electron-beam propagation direction, a Wehnelt electrode (i.e., focusing electrode) 34, an anode 35, and a ground electrode 36.

The Wehnelt electrode 34 comprises an annular end portion 34c formed at a top end of a metal cylindrical sidewall 34b. The end portion 34c comprises an upper surface 34a (i.e., the surface facing the anode 35) that is preferably conical and concave relative to the anode. The surface 34a defines a half-angle θ1 relative to the optical axis of preferably about 67.5°. The Wehnelt electrode 34 is coaxially disposed on the optical axis AX such that the upper surface 34a defines a line (dashed line) extending to the peripheral edge of the electron-emission surface 31a. The electric potential of the Wehnelt electrode 34 is either the same as, or slightly lower than, the electric potential of the cathode 31.

The anode 35 comprises an annular end portion 35d formed at the top end of a metal cylindrical sidewall 35c.

The end portion 35d comprises an upper surface 35a that is preferably conical (convex with respect to the cathode 31 and concave with respect to the ground electrode 36). The surface 35a preferably defines a half-angle θ2 relative to the optical axis of preferably about 80°. The end portion 35d also comprises a conical base surface 35b that faces the cathode 31 and is concave with respect to the cathode 31.

A variable electric potential 0.1–10 kV higher than the electric potential of the cathode 31 is preferably applied to the anode 35. The cathode current is preferably adjusted by changing the electric potential of the anode 35. Adjustment of the cathode current permits adjustment of electron-gun current, brightness, beam current, beam current density, etc.

The ground electrode 36 is preferably a metal plate defining an aperture 36a for passage of the electron beam EB therethrough. The aperture 36a is centered on the optical axis AX. The ground electrode 36 defines a base surface 36b that faces and is convex relative to the anode 35. The ground electrode 36 is preferably connected to an earth ground during use. The edges of the aperture 36a are preferably radiused as shown to discourage electrical discharges as the electron beam EB passes through the aperture 36a.

In this example, the electron gun is preferably operated within the space-charge-limited region (i.e., a region over which, as a result of raising the temperature of cathode 31 and thereby increasing thermionic emission, space charges are increased and the magnitude of the electron-beam current is governed by the space-charge layer that is formed). If the electric potential of the anode 35 is held constant and the electron-gun current is measured while varying the cathode 31 heating current, one can confirm whether the electron gun is in the space-charge-limited region. This is performed by determining a transition in a plot of electron-beam current obtained by incrementally varying the heating current between a range in which the corresponding electron-beam current exhibits a steep slope and a range in which the corresponding electron-beam current exhibits a gentle slope. Within the space-charge-limited region, the electron-beam current is approximately determined by the voltage of anode 35.

When the half-angle θ1 of the upper surface 34a of the Wehnelt electrode 34 is about 67.5°, the electron beam EB, emitted from the electron-emission surface 31a of the cathode 31, is emitted in a substantially normal direction relative to the electron-emission surface 31a, (i.e., parallel to the optical axis AX). Under such conditions, the electric-field intensity is substantially uniform over the entire electron-emission surface 31a, and the cathode-current density is substantially constant over the entire electron-emission surface 31a. This results in less angular dependence of the intensity of the electron beam EB whenever a downstream lens causes the electron beam EB to converge or diverge, and a greater total angle $2 \cdot \alpha_g$ (i.e., the angle over which the intensity of the electron beam is uniform) than otherwise possible in prior-art electron guns.

After passing through the Wehnelt electrode 34, the electron beam EB passes through the axial opening defined by the tip 35d of the anode 35. The electron beam EB propagates toward the ground electrode 36. Because the upper surface 35a and the base surface 35b of the anode 35 are conical surfaces (i.e., respectively convex and concave relative to the cathode 31), the anode 35 operates as a concave lens of high refractive power. As a result of a synergy arising from the space-charge effect and this concave lens, the electron beam EB does not converge but propagates as a substantially parallel electron beam along the optical axis AX.

After passing through the aperture 36a, the electron beam EB propagates to the downstream optical system (not shown). Because the base surface 36b is a conical surface that is convex with respect to the cathode 31 (and convex with respect to the anode 35), the ground electrode 36 is operable as a convex lens that serves to suppress any divergence of the electron beam EB.

As a result of the foregoing, an electron beam EB is produced having a substantially uniform intensity distribution over a wide circular cross-section. In one test, when such an electron beam EB was converged by a downstream lens, an emittance value of about 200 μm·mrad was obtained. Such an emittance value is 4–5 times higher than the emittance obtained using conventional electron guns. Thus, the electron gun of this example permits the irradiation, using an electron beam having uniform intensity, a reticle pattern having a field size 4–5 times greater than with prior-art electron guns. By varying the electric potential of the anode 35, it was possible to vary the brightness of the electron gun over a range of about $1 \times 10^3$ to $2 \times 10^4$ A/cm$^2$.

FIG. 2 depicts specific details of an example embodiment of a step-and-repeat electron-beam reduction projection-lithography apparatus comprising an electron gun according to the invention. In FIG. 2, the Z axis is perpendicular to the optical axis AX; the X axis is perpendicular to the plane of the page; and the Y axis is parallel to the plane of the page. Thus, the X and Y axes define a plane perpendicular to the Z axis.

In FIG. 2, the electron gun 1 is preferably as described in the example embodiment above (FIG. 1), and comprises the cathode 31, the Wehnelt electrode 34, the anode 35, and the ground electrode 36.

The electron beam EB emitted from the electron gun 1 crosses over the optical axis AX at a first cross-over (not shown). The electron beam EB is then collimated by a condenser lens 2, deflected within the XY plane by a field-selection deflector 3, and directed toward a subfield on the reticle (mask) M. The amount of beam deflection imparted by the field-selection deflector 3 is a function of the potential supplied to the deflector 3 by a deflection driver 4 connected thereto. The deflection driver 4 is controlled by a central processor 5 that has overall operational control of the entire projection-lithography apparatus.

After passing through the reticle M, the electron beam EB propagates parallel to the optical axis AX. The electron beam EB is deflected by a first main deflector 9 and a first sub-deflector 10, after which the beam again propagates substantially parallel to the optical axis AX. Passage of the electron beam EB through a projection lens 11 causes the beam to traverse the optical axis at a "cross-over" CO in the location as shown. Subsequent passage of the electron beam EB through an objective lens 12 renders the beam capable of forming an inverted image of the reticle subfield, wherein the image is reduced in size (de-magnified) by a reduction factor b (for example, b=¼).

To position the subfield image at the proper location on the wafer W, the electron beam EB is deflected from the optical axis AX by a second main deflector 13 and a second sub-deflector 14. Thus, the electron beam EB is incident upon at a proper transfer subfield on the wafer W which is coated with a suitable electron-beam resist. The amount of deflection of the electron beam EB performed by the first main deflector 9 and first sub-deflector 10 is a function of the potential supplied to these deflectors by the deflection driver 16 connected thereto. Similarly, the amount of deflection of the electron beam EB performed by the second main deflector 13 and sub-deflector 14 is a function of the potential supplied to these deflectors by the deflection driver 17 also connected thereto. The deflection drivers 16, 17 are controlled by the central processor 5.

The reticle (mask) M is mounted parallel to the XY plane on a mask stage 6. The mask stage 6 is operable to perform, by a suitable drive mechanism (not shown) continuous movement of the reticle in the X direction and stepped movement in the Y direction relative to a mask base 7. The position of the mask stage G relative to the mask base 7 is detected using a laser interferometer 8 operable to send signals to the central processor 5.

The wafer W is mounted parallel to the XY plane on a chuck 18 mounted on a movable wafer stage 19. The wafer stage 19 comprises a drive mechanism (not shown) operable to move the chuck 18 continuously in the X direction, and in stepped fashion in the Y direction. The position of the chuck 18 in the Y direction is detected using a laser interferometer 20 that sends signals to the central processor 5.

Further with respect to this example embodiment, the pattern defined by the reticle M is subdivided in the X direction into plural field bands at a prescribed pitch; each of the field bands is respectively subdivided in the Y direction into plural subfields at a prescribed pitch. During transfer of the subfield-patterns to the wafer W, the reticle M is scanned, for example, in the +X direction synchronously with a scanning of the wafer W in the −X direction. The scan directions are opposite because, as described above, the transferred image is inverted by the electron lenses. Moreover, for a field band on the reticle M that is situated such that it crosses the optical axis AX, the electron beam EB is deflected in the Y direction by the field selection deflector 3, main deflectors 9 and 13, and sub-deflectors 10 and 14, and reduced images of the patterns in the subfields of this field band are transferred to the wafer W. By repeating such a scheme for each field band, a reduced image of the entire pattern on the reticle M is transferred to the wafer W.

The large emittance of the electron gun 1 enables the subfields on the reticle M to be larger than possible in the prior art. This allows a substantial increase in throughput (productivity).

Therefore, an electron gun according to the present invention comprises a cathode having a planar circular electron-beam emission surface transverse to the optical axis. This allows an enlargement of the total angular aperture of the beam while retaining uniformity of the beam intensity; in other words, the emittance of the beam is substantially increased over the prior art. Hence, it is now possible to perform irradiation, such as in electron-beam projection lithography, using an electron beam having a uniform intensity distribution over a wide field.

Also, by making the electric potential of the anode variable and controlling electron-gun performance by changing the electric potential of the anode, the brightness of the electron gun can be advantageously varied over a wide range.

By making conically concave the surface of the anode facing the ground electrode, the anode can operate as a concave lens. This prevents the electron beam from converging immediately after it is emitted from the cathode.

By making conically convex the surface of the ground electrode facing the anode, the ground electrode can operate as a convex lens. This prevents divergence of the electron beam after it is emitted from the electron gun.

By making conically concave the surface of the anode facing the cathode, the negative refractive power of the anode's action as a concave lens is enhanced. This results in a further increase in emittance.

Finally, because an electron-beam projection-lithography apparatus according to the invention employs an electron gun as described above, the apparatus advantageously permits a wide-field reticle pattern to be transferred, and permits the reticle pattern to be transferred with high throughput.

Whereas the invention has been described in connection with preferred embodiments, it will be understood that it is not limited to those embodiments. On the contrary, the invention is intended to encompass all alternatives, modifications, and equivalents as may be included within the spirit and scope of the invention as defined by the appended claims.

What is claimed is:

1. An electron gun for producing an electron beam, comprising, in order along an optical axis in the trajectory direction of the electron beam:
   (a) a cathode comprising a circular emission surface that is planar relative to the optical axis, the cathode producing the electron beam whenever an electric potential is applied to the cathode;
   (b) a focusing electrode having an electric potential applied thereto, the electric potential of said focusing electrode having a magnitude that is less than or equal to that of the electric potential applied to the cathode;
   (c) an anode having an electric potential applied thereto, the electric potential of said anode having a higher magnitude than that of the electric potential applied to the cathode, the electric potential of said anode being adjustable to control the brightness of the electron beam; and
   (d) a ground electrode adapted to have a ground potential.

2. The electron gun of claim 1, wherein the planar circular emission surface extends over substantially the entire surface of the cathode exposed to the anode in the direction parallel to the optical axis.

3. The electron gun of claim 1, wherein the anode comprises a conical surface axially facing the ground electrode, the conical surface being concave with respect to the ground electrode.

4. The electron gun of claim 1, wherein the ground electrode comprises a first conical surface axially facing the anode, the first conical surface being convex with respect to the anode.

5. The electron gun of claim 4, wherein the anode comprises a second conical surface axially facing the ground electrode, the second conical surface being concave with respect to the ground electrode.

6. The electron gun of claim 1, wherein the anode comprises a first conical surface axially facing the cathode, the first conical surface being concave with respect to the cathode.

7. The electron gun of claim 6, wherein the ground electrode comprises a second conical surface axially facing the anode, the second conical surface being convex with respect to the anode.

8. The electron gun of claim 7, wherein the anode comprises a third conical surface axially facing the ground electrode, the third conical surface being concave with respect to the ground electrode.

9. The electron gun of claim 6, wherein the anode comprises a second conical surface axially facing the ground electrode, the second conical surface being concave with respect to the ground electrode.

10. The electron gun of claim 1, wherein the focusing electrode comprises a first conical surface axially facing the anode, the first conical surface being concave with respect to the anode.

11. The electron gun of claim 10, wherein the anode comprises a second conical surface axially facing the ground electrode, the second conical surface being concave with respect to the ground electrode.

12. The electron gun of claim 11, wherein the ground electrode comprises a third conical surface axially facing the anode, the third conical surface being convex with respect to the anode.

13. The electron gun of claim 10, wherein the ground electrode comprises a second conical surface axially facing the anode, the second conical surface being convex with respect to the anode.

14. The electron gun of claim 13, wherein the anode comprises a third conical surface axially facing the cathode, the third conical surface being concave with respect to the cathode.

15. The electron gun of claim 10, wherein the anode comprises a second conical surface axially facing the cathode, the second conical surface being concave with respect to the cathode.

16. The electron gun of claim 15, wherein the anode comprises a third conical surface axially facing the ground electrode, the third conical surface being concave with respect to the ground electrode.

17. The electron gun of claim 1, wherein:
   (a) the anode comprises a first conical surface axially facing the ground electrode, the first conical surface being concave with respect to the ground electrode;
   (b) the ground electrode comprises a second conical surface axially facing the anode, the second conical surface being convex with respect to the anode;
   (c) the anode comprises a third conical surface axially facing the cathode, the third conical surface being concave with respect to the cathode; and
   (d) the focusing electrode comprises a fourth conical surface axially facing the anode, the fourth conical surface being concave with respect to the anode.

18. The electron gun of claim 17, wherein the first conical surface defines a half angle relative to the optical axis of about 80 degrees, and the fourth conical surface defines a half angle relative to the optical axis of about 67.5 degrees.

19. An electron-beam projection-lithography apparatus, comprising:
   (a) the electron gun of claim 17;
   (b) an irradiation system converting the electron beam emitted by the electron gun into a collimated electron beam that can irradiate a pattern defined by a reticle disposed across the trajectory of the collimated electron beam; and
   (c) an imaging lens system operable to focus the electron beam, after the electron beam has passed through the reticle, onto a substrate surface, so as to transfer the pattern onto the substrate surface.

20. The apparatus of claim 19, wherein the first conical surface defines a half angle relative to the optical axis of about 80 degrees, and the fourth conical surface defines a half angle relative to the optical axis of about 67.5 degrees.

21. An electron-beam projection-lithography apparatus, comprising:
   (a) the electron gun of claim 1;
   (b) an irradiation system converting the electron beam emitted by the electron gun into a collimated electron beam that can irradiate a pattern defined by a reticle disposed across the trajectory of the collimated electron beam; and (c) an imaging lens system operable to focus the electron beam, after the electron beam has passed through the reticle, onto a substrate surface, so as to transfer the pattern onto the substrate surface.

22. An electron gun for producing an electron beam, comprising, in order along an optical axis in the trajectory direction of the electron beam:

(a) a cathode comprising a circular emission surface, the emission surface being planar with respect to the optical axis;

(b) a focusing electrode;

(c) an anode; and (d) a ground electrode comprising a surface facing the anode, said surface being convex with respect to the anode.

23. The electron gun of claim 22, wherein the cathode has an electric potential applied thereto, the focusing electrode has an electric potential applied thereto, and the anode has an electric potential applied thereto, the magnitude of the electric potential applied to the focusing electrode being less than or equal to the magnitude of the electric potential applied to the cathode, and the magnitude of the electric potential applied to the anode being greater than the magnitude of the electric potential applied to the cathode.

24. The electron gun of claim 23 wherein the electric potential applied to the anode is adjustable to control the brightness of the electron beam.

25. An electron-beam projection-lithography apparatus, comprising:

(a) the electron gun of claim 22;

(b) an irradiation system converting the electron beam emitted by the electron gun into a collimated electron beam that can irradiate a pattern defined by a reticle disposed across the trajectory of the collimated electron beam; and (c) an imaging lens system focusing the electron beam, after the electron beam has passed through the reticle, onto a substrate surface, so as to transfer the pattern onto the substrate surface.

* * * * *

UNITED STATES PATENT AND TRADEMARK OFFICE
CERTIFICATE OF CORRECTION

PATENT NO. : 5,763,893
DATED : June 9, 1998
INVENTOR(S) : Mamoru Nakasuji

It is certified that error appears in the above-indentified patent and that said Letters Patent is hereby corrected as shown below:

Column 8, line 10, "stage G" should read --stage 6--.

Signed and Sealed this

Sixteenth Day of November, 1999

Attest:

Q. TODD DICKINSON

Attesting Officer     Acting Commissioner of Patents and Trademarks